United States Patent [19]

Galloway

[11] 3,836,791

[45] Sept. 17, 1974

[54] PRESETTABLE SINGLE-INPUT VOLTAGE-TIME INTEGRATOR

[75] Inventor: Glen L. Galloway, Los Angeles, Calif.

[73] Assignee: The United States of America as represented by the Secretary of the Navy, Washington, D.C.

[22] Filed: July 13, 1973

[21] Appl. No.: 379,144

[52] U.S. Cl. .................. 307/293, 307/229, 307/235, 307/251, 307/304, 328/127

[51] Int. Cl. ......................... H03k 17/26, G06g 7/12

[58] Field of Search ........... 307/228, 229, 293, 235, 307/251, 304; 328/127, 129

[56] References Cited

UNITED STATES PATENTS

| | | | |
|---|---|---|---|
| 3,286,192 | 11/1966 | Collings et al. | 307/229 |
| 3,419,784 | 12/1968 | Winn | 328/127 |
| 3,482,116 | 12/1969 | James | 307/228 |
| 3,539,825 | 11/1970 | Hardway | 307/229 |
| 3,553,723 | 1/1971 | Ohnsorg | 307/229 |
| 3,564,428 | 2/1971 | Demark | 328/127 |
| 3,594,649 | 7/1971 | Rauch | 328/127 |
| 3,636,332 | 1/1972 | Nelson et al. | 307/229 |
| 3,769,598 | 10/1973 | Schauffele et al. | 307/228 |

*Primary Examiner*—Stanley D. Miller, Jr.
*Attorney, Agent, or Firm*—Richard S. Sciascia; Ervin F. Johnston; John Stan

[57] ABSTRACT

A timing circuit capable of operation from a single-input waveform, comprising an integrator circuit which includes: (1) a series resistor-capacitor (R–C) combination, one end of the resistor of the R–C combination comprising the input to the timing, and integrator, circuit; (2) an operational amplifier connected across the capacitor of the R–C combination, the amplifier serving to integrate the single-input waveform; and (3) a metal-oxide, semiconductor, field-effect transistor (MOSFET), serving as a switch, connected across the operational amplifier, the source of the MOSFET switch being connected to the input of the operational amplifier, at the junction of the R–C combination, the drain of the MOSFET switch being connected to the output of the operational amplifier.

The timing circuit further comprises a comparator circuit which includes (1) a voltage comparator, which compares the two voltages at its inputs, and can detect when the difference between its two inputs equals zero, the output of the comparator being connected to the gate of the MOSFET; (2) an isolation resistor connected between the output of the operational amplifier and one of the inputs of the voltage comparator; (3) a zener diode connected across the two inputs of the voltage comparator; and (4) a compensation resistor having one end connected to the other input of the voltage comparator, the other end of the resistor being grounded.

The result being that, when the output of the amplifier reaches zero, the signal at the output lead of the comparator, and therefore at the gate of the MOSFET, causes the MOSFET to conduct, clamping the output of the operational amplifier at a zero voltage level, thus providing initialization of the timing cycle.

5 Claims, 6 Drawing Figures

SINGLE-INPUT TIMING CIRCUIT

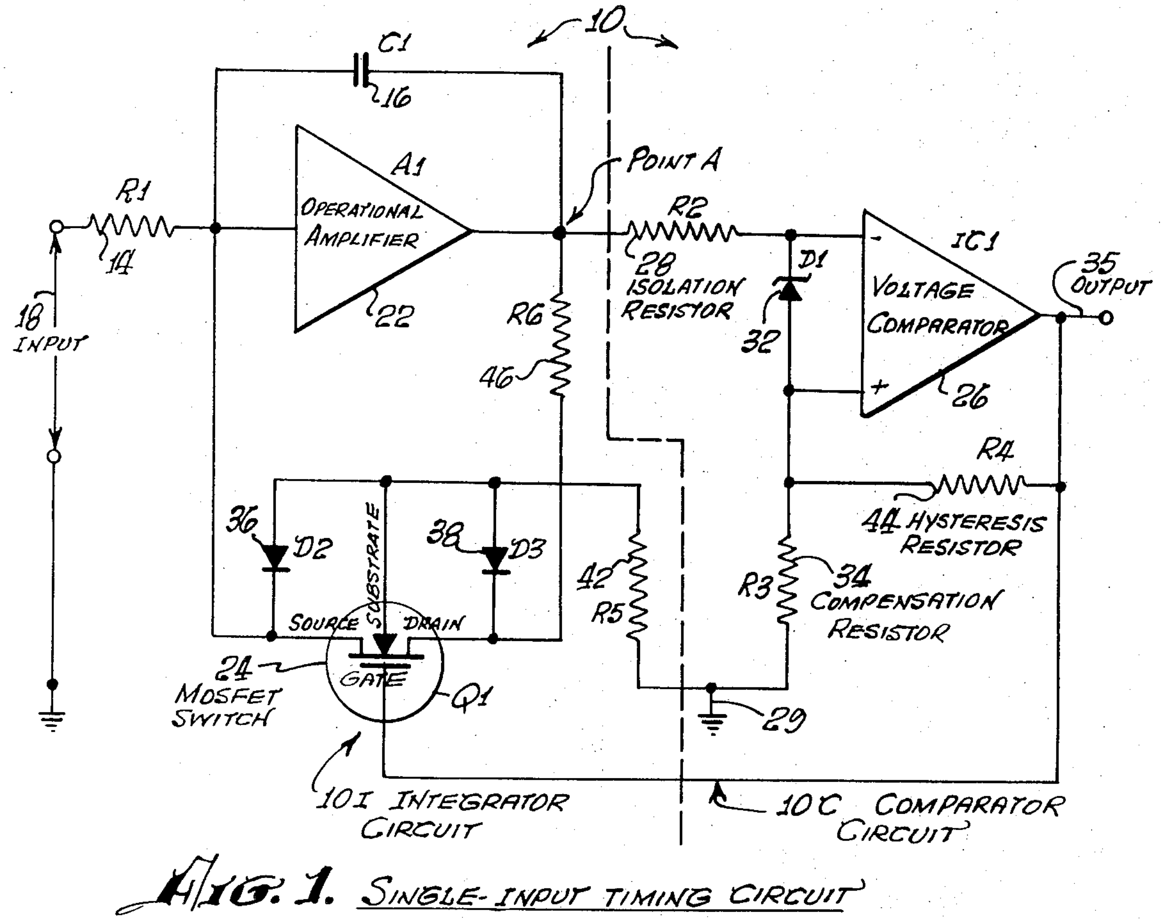
FIG. 1. SINGLE-INPUT TIMING CIRCUIT
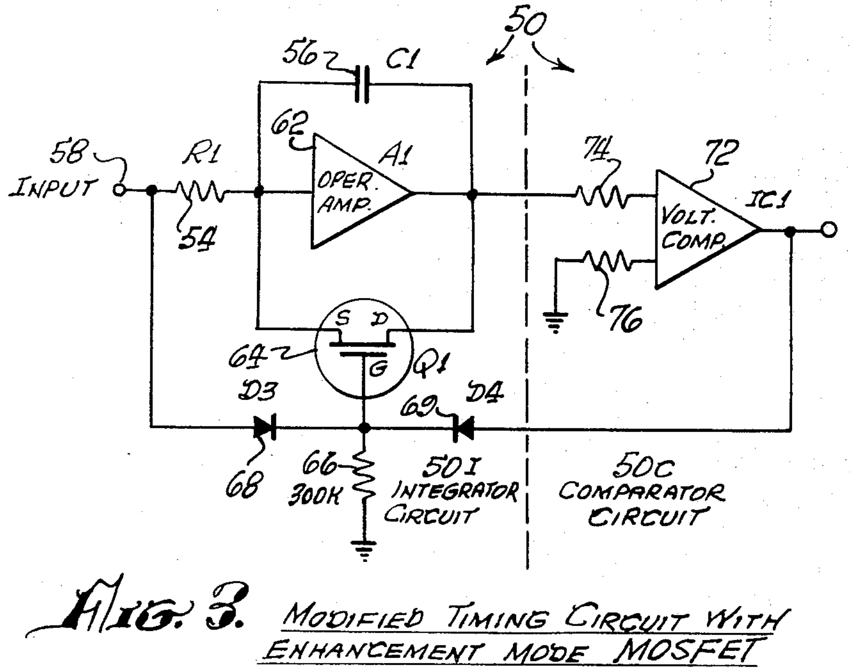
FIG. 3. MODIFIED TIMING CIRCUIT WITH ENHANCEMENT MODE MOSFET

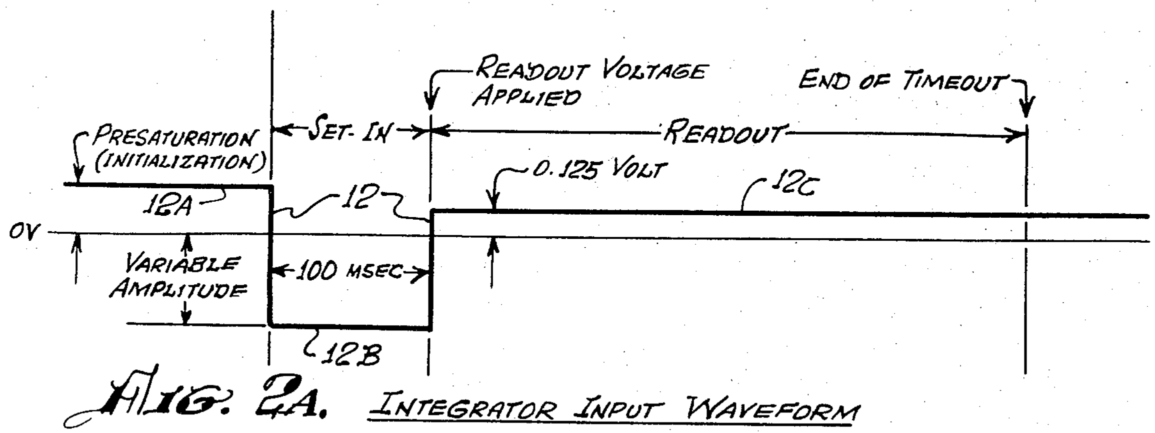
FIG. 2A. INTEGRATOR INPUT WAVEFORM
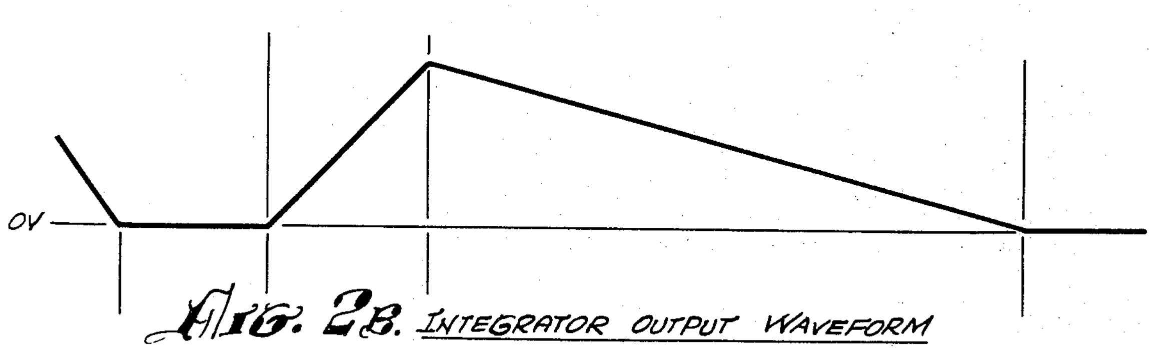
FIG. 2B. INTEGRATOR OUTPUT WAVEFORM
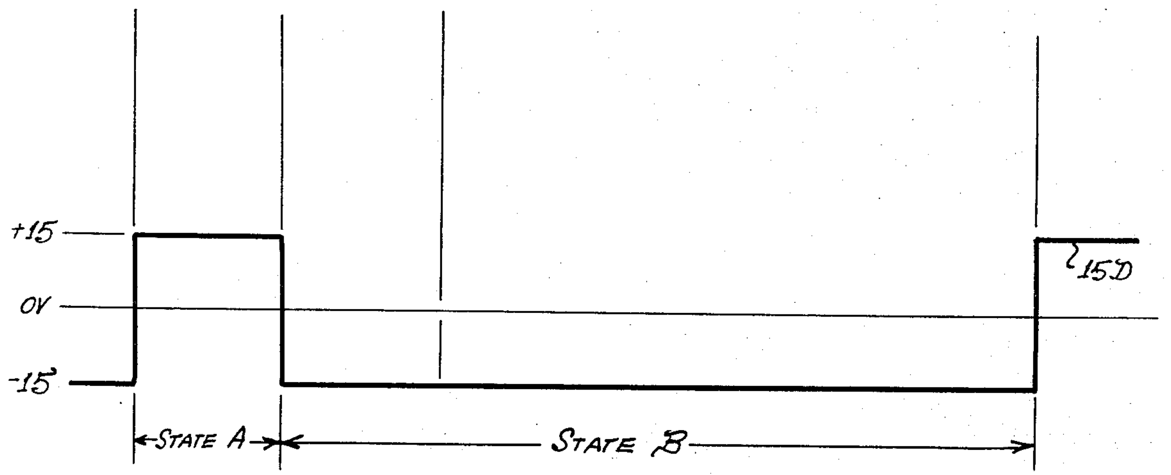
FIG. 2C. COMPARATOR WAVEFORM
FIG. 2. TIMING CIRCUIT WAVEFORMS

PRESETTABLE SINGLE-INPUT VOLTAGE-TIME INTEGRATOR

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

In general terms, this invention relates to electronic circuitry which is able to accomplish analog integration and timing functions in any electronic system requiring highly accurate integrating and timing circuits.

More specifically, this invention relates to electronic circuitry which can be preset to some desired voltage-time integral, and which can in turn integrate a voltage proportional to a measured system parameter, and provide an output signal when the time integral of the parameter voltage is equivalent to the preset voltage-time integral.

DESCRIPTION OF THE PRIOR ART

There are two patents which describe typical circuits used to provide accurate integrating and timing functions. One of the two is U.S. Pat. No. 2,822,511, to W. B. McLean et al., which issued on Feb. 4, 1958, and is entitled MAGNETIC INTEGRATOR.

The invention described therein relates to a magnetic integrator comprising a saturable reactor core capable of being positively or negatively saturated, and a first and a second winding wrapped around said core, the core adapted initially to be either positively or negatively saturated. A voltage may be applied across the first winding in such a direction as to drive the core from its initial condition. A resistor is in series with the second winding, the impedance of the resistor substantially equalling the impedance of the second winding, when the core is unsaturated. A source of A.C. voltage is in series with the second winding and the resistor. A relay is operative when the voltages across the second winding and the resistor are substantially equal.

The second patent describing typical circuits used to provide accurate integrating and timing functions is U.S. Pat. No. 3,011,714 to D.H. Wheeler, which issued on Dec. 5, 1961, and is entitled SETTABLE MAGNETIC INTEGRATOR. This second patent relates to a settable magnetic integrator for use in analog computer applications, more specifically, in combination with a transistorized programming circuit. The circuit offers the capability of having a settable total-integral value, and has this total integral value fixed by the magnetic and physical characteristics of the integrating coil.

The magnetic integrator gives a measure of the time integral of a voltage where the voltage may vary in magnitude and may, under certain conditions be zero or even negative.

SUMMARY OF THE INVENTION

The novel integrator of this invention uses operational amplifier techniques and a unique voltage-limiting technique which does away with the need for special magnetic integrator assemblies. Instead, the circuit technique provides integration of the same input waveform while making use of components which are readily available from many different manufacturing sources.

A unique feature of this invention is its operation from a single input voltage waveform. This method decreases the number of control signals required to provide integration since initialization (sometimes called presaturation), set-in of the desired voltage-time integral and integration of the system parameter voltage (read-out) can all be accomplished by controlling the voltage waveform of the circuit input.

Another new and unique feature is the use of a voltage comparator to detect when the output of the integrator reaches a desired limiting voltage level. When that voltage level is reached, the output of the voltage comparator is used to bias the gate of a metal-oxide field effect transistor (MOSFET), with the result that the impedance between the drain and source terminals of the MOSFET is reduced from $10^9$ ohms or higher to a few hundred ohms or less. Since the MOSFET connects the input and output of the integrating amplifier, the effect of the reduced impedance is to change the circuit function from integration to that of an extremely low-gain amplifier, and the output voltage of the amplifier is clamped at the comparator voltage level. The MOSFET acts as a voltage-actuated switch which turns on or off as desired. This clamping level provides a fixed initialization level from which accurate voltage-time integration can be accomplished. This use of a voltage comparator and a voltage-operated switch to provide circuit initialization under the control of the single input control signal is a unique concept of this invention.

OBJECTS OF THE INVENTION

An object of the invention is the provision of a timing circuit which can perform an integrating and a timing function.

Another object of the invention is the provision of timing circuit which can perform an integrating and timing function from a single input waveform.

Yet another object of the invention is the provision of a timing circuit which is presettable to provide a useful output voltage within a certain range.

Other objects, advantages and novel features of the invention will become apparent from the following detailed description of the invention, when considered in conjunction with the accompanying drawings, wherein:

BRIEF DESCRIPTION OF THE DRAWINGS

FIG. 1 is a schematic diagram of the single-input timing circuit of this invention.

FIG. 2 is a set of three graphs, FIGS. 2A, 2B and 2C, showing typical timing circuit waveforms.

FIG. 3 is a schematic diagram of another timing circuit, using an enhancement mode MOSFET.

DESCRIPTION OF THE PREFERRED EMBODIMENTS

Referring now to FIG. 1, this figure shows a timing circuit 10 capable of operation from a single-input waveform 12, shown in FIG. 2A, comprising an integrator circuit 101 which includes a series resistor-capacitor (R–C) combination, 14 and 16, one end of the resistor of the R–C combination comprising the input 18 to the timing, and integrator 10I, circuit. An operational amplifier 22 is connected across the capacitor 16 of the R–C combination, the amplifier serving to integrate the single-input waveform 12. A metal-oxide, semiconductor, field-effect transistor (MOSFET) 24, serving as a switch, is connected across the operational amplifier 22, the source of the MOSFET switch being connected to the input of the operational amplifier, at the junction of the R–C combination, 14 and 16, the drain of the MOSFET switch being connected to the output of the operational amplifier.

The timing circuit 10 further comprises a comparator circuit 10C which itself comprises a voltage comparator 26, which compares the two voltages at its inputs, and can detect when the difference between its two inputs equals zero, the output of the comparator being connected to the gate of the MOSFET 24. An isolation resistor 28 is connected between the output of the operational amplifier 22 and one of the inputs of the voltage comparator 26. A zener diode 32 is connected across the two inputs of the voltage comparator 26. A compensation resistor 34 has one end connected to the other input of the voltage comparator 26, the other end of the resistor being grounded.

The result being that, when the output of the amplifier 22 reaches zero, the signal at the output lead of the comparator 26, and therefore at the gate of the MOSFET 24, causes the MOSFET to conduct, clamping the output of the operational amplifier at a zero voltage level, thus providing initialization of the timing cycle.

The timing circuit 10 shown in FIG. 1 may further comprise two diodes, 36 and 38, having one of their similar electrodes connected together and to the substrate of the MOSFET 24, one of the other electrodes of one of the diodes being connected to the source of the MOSFET, and the other electrode of the other diode being connected to the drain of the MOSFET. A resistor 42 has one end connected to the substrate of the MOSFET 24, the other end being grounded.

The timing circuit 10 may further comprise a hysteresis resistor 44, connected between the ungrounded end of the compensation resistor 34 and the output 35 of the comparator 26.

Discussing more theory about the invention, the integrator 10I uses an operational amplifier 22, which has been done in the prior art, but this invention varies from the prior art in that the integrator can be automatically initialized by the input waveform. This capability is provided by using a voltage comparator 26 to detect when the output of the integrator circuit 10I reaches zero. At this time the comparator 26 turns on the MOSFET 24, which clamps the output of the integrator 10I at zero level and provides the initialization point. Thus, any positive voltage applied to the input 18 for a sufficient time (maximum volt-time product being approximately 10 volt-seconds with the circuit design shown) will bring the integrator 10I to its initialized state.

The integrator circuit 10I requires no calibration and will function after simple assembly with errors less than 0.25 percent of full scale output over a temperature range of 60° Celsius. An additional feature of the invention is the use of chopper stabilized amplifiers, which have recently become available in modular form from several manufacturers.

Three characteristics of the operational amplifier 22 are important when it is to be used as an integrator: high input impedance, high voltage gain, and low output impedance. If the current drawn by the amplifier 22 is ignored, that is, if it has high input impedance, then the input current $i_{in}$ is nearly equal to the feedback current $i_f$, from Kirchhoff's Law, $$i_{in} = i_f \quad (1)$$

Since the voltage on the inverting input is nearly zero, because of the high voltage gain and negative feedback, $$i_{in} = V_{in}/R1 \text{ (low impedance voltage source)} \quad (2)$$

$$i_f = C1\ (dV_{out}/dt) \text{ (low output impedance)} \quad (3)$$

Substituting Eqs. (2) and (3) into Eq. (1), rearranging terms, and integrating derives the equation for integration $$V_{out} = \frac{1}{R1C1} \int_0^t V_{in}\, dt \quad (4)$$

This voltage appears at POINT A in FIG. 1.

Timing is accomplished by initially applying a positive presaturation voltage, shown in FIG. 2A and 12A and applied at input 18 of FIG. 1, which drives the output FIG. 2B of the integrator circuit 22 in the negative direction until initialization occurs. A negative pulse, 12B in FIG. 2A, of fixed width (100ms) and variable amplitude is then applied to set in the desired time value (since the pulse width is fixed, time is directly proportional to amplitude.) After a chosen event has occurred, a fixed amplitude (0.125 volt) readout voltage, 12C in FIG. 2A, is applied to the circuit, 10C and timing is *ta*. When the output of the integrator circuit 10I reaches zero, the comparator 26 again switches, providing the switching signal output, 15D in FIG. 2C, that indicates the end of the timing interval.

It should be pointed out that the set-in pulse, 12B in FIG. 2A, does not necessarily have to be of a fixed width and variable amplitude The set-in pulse 12B may also be controlled by having a fixed amplitude and variable width. It is the volt-second product which is variable. Curve 12B need not even be a horizontal line.

The following is a list of the components in the timing circuit 10 with a brief description of their functions. Refer to FIG. 1.

A1 — Chopper Stabilized Operational Amplifier (CSOA) 22 and 62, (Burr Brown, Inc., Part No. 3355). 6730 S. Tuscon Blvd. Arizona 85706.

IC1 — Voltage Comparator, 26 and 72, (Optical Electronics, Inc., Part No. 5501). Box 11140, Tucson, Arizona 85706.

Q1 — MOSFET Switch $Q_1$, 16 and 56, (Part No. MFE 3002). Motorola Semiconductor Products, Box 20912, Phoenix, Arizona 85036.

C1 — Integrating Capacitor, 16 and 56, 10$\mu f$ or 2.0$\mu f$.

R1 — Input Resistor, 14 and 54, 550 KΩ.

R2 — Isolation Resistor, 28 2.0KΩ.— isolates the input of voltage comparator, 26 or 72, and diode 32 from the output of operation amplifier 22 or 62 and limits the current through diode 32 in conjunction with R3.

- R3 — Compensation Resistor, 34, 2.0KΩ—compensates for offset produced by voltage drop across resistor 28 by introducing a similar drop across the positive input.
- D1 — Zener Diode, 32, 2.5 volt—prevents input voltage to comparator 26 from exceeding design limits.
- R4 — Hysteresis Resistor, 44 22 MΩ — introduces hysteresis into the comparator circuit 10C to prevent oscillation near the switching point. (May be decreased to 10 MΩ if necessary).
- D2,D3,R5 — Diodes, 1N3595 or SSD708, 36 and 38 and Resistor 42, 100 KΩ — used to tie down the substrate and eliminate noise.
- R6 — Resistor to increase FET "on resistance," 100Ω.

Referring now to FIG. 3, this figure shows another embodiment of a timing circuit 50, comprising an integrator circuit 50I which includes a series resistor-capacitor (R–C) combination, 54 and 56, one end of the resistor of the R–C combination comprising the input 58 to the timing, and integrator, circuit. An operational amplifier 62 is connected across the capacitor 56 of the R–C combination, the amplifier serving to integrate an input waveform at input 58. A metal-oxide, semi-conductor, field effect, transistor (MOSFET) 64 serving as a switch, is connected across the amplifier 62, the source of the MOSFET being connected to the input of the amplifier, at the junction of the R–C combination, the drain of the MOSFET being connected to the output of the amplifier. A resistor 66 has one end connected to the gate of the MOSFET 64, the other end being grounded.

Included in the integrator circuit 50I is a first diode 68, having one element connected between the signal input side of the resistor 54 of the R–C combination, with the other element being connected to the gate of the MOSFET 64. A second diode 69, having the same element as the first-named element of the first diode 68 also connected to the gate of the MOSFET 64.

The timing circuit 50 also comprises a comparator circuit 50C which includes a comparator 72, which compares the voltages at its two inputs. A comparator input resistor 74 is connected between the output of the operational amplifier 62 and one of the inputs of the comparator 72. Another resistor 76 has one end being to the other input of the comparator 72, the other end being grounded. The output of the comparator 72 is connected to the other element of the second diode 69.

MOSFET 62 is an enhancement mode MOSFET. $V_{ps}$ and supply power are applied concurrently. $V_{ps}$ biases diode 68 on and then appears at the gate of MOSFET 62, turning it on and clamping $V_{c1}$ the voltage across capacitor 56, at zero. Diode 68 also blocks the negative set-in pulse from the gate of MOSFET 64. During a timeout cycle, a voltage $V_{in}$ is applied to the gate of MOSFET 64 through diode 68. However, 0.125 volt is not sufficient to turn MOSFET 64 on and it stays off. In this condition, diode 69 isolates the negative output of comparator 72 from the input of the integrator.

Discussing now alternative components which may be used, any operational amplifier may be substituted for the one, 22 or 62, used in this circuit. Amplifier selection is dependent only on the desired integration accuracy. It is only necessary to make sure that the supply voltages are changed to meet amplifier requirements. The circuit of this invention was designed to have a 10 volt-second integration capacity by proper selection of resistor R1 and capacitor C1, however this selection can be varied to meet the particular needs of the system in which the circuit is used.

Any scheme for obtaining voltage comparison may be used for the voltage comparator, 26 or 72. It could be another operational amplifier used as a voltage comparator, a Schmitt trigger circuit, or even a voltage-sensitive relay. The MOSFET, 24 or 64 can be replaced by any device which will act as a voltage actuated switch, such as a relay or a transistor switch. Again it should be emphasized that component selection should be determined by the accuracy, speed and range requirements of the system in which the device is used.

Another alternative design would be to vary the ratio of resistors 34 and 44 in FIG. 1, and adjusting the comparison voltage level to obtain fixed offset differences between the voltage-time integral of the set-in pulse and that of the readout voltage to meet any peculiar requirement of a system. This adjustment affects only the offset, the vertical axis intercept, of the difference curve and not the slope. The slope of the difference curve may be adjusted by changing the amplitude of the actual readout voltage in comparison with the calculated value. These two adjustments allow for compensation of component deficiency effects on the circuit's accuracy.

Obviously many modifications and variations of the present invention are possible in the light of the above teachings. It is therefore to be understood that within the scope of the appended claims the invention may be practiced otherwise than as specifically described.

What is claimed is:

1. A timing circuit capable of operation from a single-input waveform, comprising:

an integrator circuit which comprises:

- a series resistor-capacitor (R–C) combination, one end of the resistor of the R–C combination comprising the input to the timing, and integrating, circuit;
- an operational amplifier connected across the capacitor of the R–C combination, the amplifier serving to integrate the single-input waveform;
- a metal-oxide, semiconductor, field-effect transistor (MOSFET), serving as a switch, connected across the operational amplifier, the source of the MOSFET switch being connected to the input of the operational amplifier, at the junction of the R–C combination, the drain of the MOSFET switch being connected to the output of the operational amplifier;

the timing circuit further comprising a comparator circuit which comprises:

- a voltage comparator, which compares the two voltages at its inputs, and therefore can detect when the difference between its two inputs equals zero, the output of the comparator being connected to the gate of the MOSFET;
- an isolation resistor connected between the output of the operational amplifier and one of the inputs of the voltage comparator;
- a zener diode connected across the two inputs of the voltage comparator;

a compensation resistor having one end connected to the other input of the voltage comparator, the other end of the resistor being grounded;

with the result that, when the output of the amplifier reaches zero, the signal at the output lead of the comparator, and therefore at at the gate of the MOSFET, causes the MOSFET to conduct, clamping the output of the operational amplifier at a zero voltage level, thus providing initialization of the timing cycle.

2. The timing circuit according to claim 1, further comprising:

two diodes having one of their similar electrodes connected together and to the substrate of the MOSFET, one of the other electrodes of one of the diodes being connected to the source of the MOSFET, and the other electrode of the other diode being connected to the drain; and a resistor, having one end connected to the substrate of the MOSFET, the other end being grounded.

3. The timing circuit according to claim 2, further comprising:

a hysteresis resistor connected between the ungrounded end of the compensation resistor and the output of the comparator.

4. A timing circuit comprising:

an integrator circuit which comprises:

a series resistor-capacitor (R–C) combination, one end of the resistor of the R–C combination comprising the input to the timing, and integrator, circuit;

an operational amplifier connected across the capacitor of the R–C combination, the amplifier serving to integrate an input waveform;

a metal-oxide semiconductor, field effect transistor (MOSFET), serving as a switch, connected across the amplifier, the source of the MOSFET being connected to the input of the amplifier, at the junction of the R–C combination, the drain of the MOSFET being connected to the output of the amplifier;

a resistor, one end of which is connected to the gate of the MOSFET, the other end of which is grounded;

a first diode, having one element connected between the signal input side of the resistor of the R–C combination and the other element being connected to the gate of the MOSFET;

a second diode, having the same element as the first-named element of the first-named diode also connected to the gate of the MOSFET;

the timing circuit also comprising a comparator circuit which comprises:

a comparator, which compares the voltages at its two inputs;

a comparator input resistor, connected between the output of the operational amplifier and one of the inputs of the comparator;

another resistor, one end being connected to the other input of the comparator, the other end being grounded;

the output of the comparator being connected to the other element of the second diode.

5. The timing circuit according to claim 3, further comprising:

another resistor, connected between the output of the operational amplifier and the drain of the MOSFET.

* * * * *